United States Patent [19]

Kubacki

[11] 4,262,631

[45] Apr. 21, 1981

[54] THIN FILM DEPOSITION APPARATUS USING AN RF GLOW DISCHARGE

[76] Inventor: Ronald M. Kubacki, 10296 Alpine, #C, Cupertino, Calif. 95014

[21] Appl. No.: 80,941

[22] Filed: Oct. 1, 1979

[51] Int. Cl.³ .............................................. C23C 15/00
[52] U.S. Cl. ................................. 118/723; 204/164; 422/149; 427/39
[58] Field of Search ................... 118/723; 427/39–41; 204/164, 170; 250/531; 219/121.1, 121.12, 121.17, 121.23; 422/149, 186

[56] References Cited

U.S. PATENT DOCUMENTS

| | | | |
|---|---|---|---|
| 3,005,762 | 10/1961 | Fenn | 204/164 |
| 3,424,661 | 1/1969 | Androshek et al. | 204/164 |
| 3,757,733 | 9/1973 | Reinberg | 118/732 X |
| 4,066,037 | 1/1978 | Jacob | 118/725 |

*Primary Examiner*—Morris Kaplan
*Attorney, Agent, or Firm*—Thomas E. Schatzel

[57] ABSTRACT

An RF plasma deposition apparatus for depositing a film of material on substrates positioned in a vertical plane and electrically "floating" within the glow discharge. For deposition of silicon nitride films, the apparatus is adapted to introduce silane gas in a substantially uniform and laminar flow into a coating cavity containing substrates, a ground screen electrode, and a "hot" RF electrode, within which a glow discharge is ignited. Elemental nitrogen may be delivered to the coating cavity after being dissociated in a local, separate RF plasma called an "atomizer" cavity. During coating, elemental nitrogen combines with elemental silicon and deposits silicon nitride upon the substrate surface.

20 Claims, 12 Drawing Figures

Fig_1

Fig_10

Fig_6

Fig_7

Fig_8

Fig_12

THIN FILM DEPOSITION APPARATUS USING AN RF GLOW DISCHARGE

BACKGROUND OF THE INVENTION

1. Field of the Invention

The invention relates to an apparatus for the deposition of thin films in the presence of a radio frequency (RF) glow discharge or "plasma." The apparatus of the invention is particularly suited for deposition of silicon nitride films as a final passivation step in the production of integrated circuits. However, the apparatus may be used to generally form films where the reactant gases possess widely varying binding energies and/or do not lend themselves to premixing.

2. Description of the Prior Art

Various ways are known in the art for applying a layer or film of material upon a substrate or base material. Such methods include spin coating with subsequent solidification and/or crosslinking, evaporation, sputtering, plating, chemical vapor deposition, and plasma deposition by the use of a RF glow discharge. Each such technique has its inherent advantages and disadvantages with respect to certain desired results. In the case of RF glow discharge plasma desposition, gas reactants are broken down into ionized species in the presence of radio frequency (RF) excitation; e.g., 13.56 mHz. It is theoretically possible, once the reactant gases have been ionized, to recombine the elemental species into a desired form. Alternatively, a particular film might be formed by chemical vapor deposition (CVD). However, CVD must be performed at high temperatures in the order of 1000° C. to 1600° C. and above. Such high temperatures often damage substrate structures which include aluminum conductors as aluminum melts at less than 600° C. Alternatively, sputtering and electron beam evaporation are conceivable methods for forming a film, but the properties of a sputtered film may not exhibit the adhesion, density, or resistance to etching as required, and sputtering and evaporation have generally not been effective for non-conductors. In the end result, every thin film deposition problem must be dealt with on the basis of the particular technologies desired to be employed and the results needed to be achieved.

Specifically, the application of silicon nitride to the manufacture and the production of integrated circuits is critical. Silicon nitride films are utilized as a final passivating or protecting layer for an integrated circuit. The silicon nitride performs the function of an impermeable boundary between the corrosive and damaging atmosphere and the delicate integrated circuit thereunder. The alternative method in lieu of silicon nitride passivation is the sealing of the integrated circuit within a ceramic package. While the use of the ceramic packaging technique is technically sufficient to hermetically seal the integrated circuit, it is prohibitively costly for high volume production. It has, thus, become desirable to hermetically seal integrated circuits by use of a thin silicon nitride layer.

There are several problems, however, with silicon nitride films as currently applied by the teachings of the prior art. Silicon nitride may be applied by chemical vapor deposition, but the reaction temperatures in excess of 1000° C. are often devastating to the integrated circuits that the silicon nitride layer is designed to protect. In fact, some integrated circuits should not be exposed to any temperatures in excess of 100° C. In addition silicon nitride is an excellent insulator, and the semiconductor industry would consider using silicon nitride as an interlayer dielectric for forming capacitors and other active elements of integrated circuits, but the quality of the presently available silicon nitride films as formed by RF glow discharge plasma techniques are insufficient for such an application. Insulating characteristics of a dielectric material are evaluated by measuring the "flat band voltage" of the film which measures the capacitance of a test sample as a function of voltage applied. Porous films of unpredictable quality with considerable amounts of trapped charges and with poor and variable dielectric constants result from the use of prior art plasma deposition systems making silicon nitride films produced therefrom unacceptable in terms of their flat band voltage characteristics. In addition, silicon nitride films as produced by current technologies vary widely in the internal stresses resulting during deposition, etch rates of the film in suitable etchants, adhesion characteristics, imperviousness to sodium diffusion, and index of refraction. If silicon nitride plasma deposited films could be obtained of sufficient quality at a low enough application temperature, such films could be used for diffusion masking of gallium arsenide, a particularly temperature sensitive substrate used in the manufacture of light emitting diodes. To date such films have not been commercially achieved by the use of plasma reactors of the prior art. In fact, films deposited by RF glow discharge plasma deposition of silicon nitride vary so much that they bear little relationship to "beta" crystaline $Si_3N_4$ which is the only absolutely determinable standard for comparison.

In the art concerned with plasma deposition of silicon nitride, U.S. Pat. No. 3,757,733 to Reinberg discloses the use of a radial flow reactor for the plasma deposition of silicon nitride and other film materials. The radial flow reactor is a radially symmetrical chamber in which substrates to be coated are arranged on a circular fixture at ground potential in a plurality of concentric rows. Reactant gases are introduced into the chamber concentric with the sample mounting fixture from below said fixture and circulate under the action of a vacuum pump to the top face of the fixture where the samples reside. The uppermost face where the samples are fixtured has a central port connected to the vacuum pump through which reacting gases exit. In other words, a radial flow of reacting gases is created from the inlet of the chamber to the exit from the chamber. In addition, the fixture upon which the samples are rigidly held is at RF ground potential, and an upper plate of the vacuum chamber forms the driven or "hot" electrode of the RF plasma system. When the RF source is energized, a plasma is struck between the upper plate of the vacuum chamber and the circularly shaped mount upon which the substrates are fixtured. Heaters are included as part of the substrate fixturing arrangement on the underside of the fixture in order to heat the substrates during deposition to temperatures of approximately 200° C. to 400° C. With the exception of rotation of the mounting fixture to which the substrates are held wherein such rotation is effected during the deposition process and the direction of flow of the reactant gases within the reaction chamber, the radial flow reactor as taught by Reinberg is similar to the Plasma I Low Temperature Nitride Reactor manufactured by Applied Materials, Inc., Santa Clara, Calif.

The radial flow reactor as taught by Reinberg suffers from several problems inherent in its design. First, the flow of the reactant gases, while theoretically symmetrical in entering or exiting from the reactor chamber, is inherently nonuniform in terms of the mass density of reactant gases as a function of radius across the substrate mounting fixture. In other words, the mass density of reactant gases must be greater at the center of the circularly shaped substrate mounting fixture than at its periphery. This creates an inherent reaction nonuniformity as a function of the location of the substrate radially upon the substrate mounting fixture.

Second, while it is desirable to utilize semiconductor grade pure diatomic nitrogen ($N_2$) as the nitrogen donor gas and silane ($SiH_4$) as the silicon donor gas in order to form silicon nitride, the binding energy of diatomic nitrogen is approximately three times the binding energy of silane. That is, on a statistical basis, it will be much less probable that the reaction chamber as taught by Reinberg will contain a theoretical three silicon ions to four nitrogen ions if approximately equal atomic proportions of silane and nitrogen are utilized, because they will not dissociate in such a relationship. In fact, Reinberg suggests that a good nitride deposition coating can be achieved by a fairly high nitrogen to silane ratio particularly on the order of about 200 to 1. This attests empirically to the inefficency of the RT glow discharge plasma dissociation of the nitrogen with respect to the silane. In order to get around this problem, it is not uncommon with the Reinberg reactor (as well as that manufactured by Applied Materials, Inc.) to introduce ammonia ($NH_3$) as one of the component reactant gases as a nitrogen donor, because the binding energy of nitrogen to hydrogen in ammonia is approximately equal to the binding energy of the silicon to hydrogen bond in silane. The problems inherent with the use of ammonia are many: ammonia is an inherently corrosive gas, extremely harsh on the components of the reactor system including valves, conduits, and vacuum pumps; ammonia is difficult to obtain in extremely pure grades thereby introducing contaminants into the system; ammonia brings with it the unwanted byproduct of hydrogen during its dissociation which must be disposed of lest it end up as an unwanted contaminant within the silicon nitride film.

A third deficiency of the Reinberg reactor is its horizontal disposition of the substrates within the reactor chamber. The plasma deposition of silicon nitride creates particulates which are contaminants with respect to the ultimate deposition of silicon nitride upon the substrates. In a horizontally disposed reactor with respect to gravity, particulates inevitably fall upon the substrates to be coated and are thereby included as part of the film. The critical properties of films with particulate contaminants included therein are extremely degraded.

Fourth, the substrates in the Reinberg reactor are fixtured to the ground potential electrode of the RF glow discharge. Surrounding both plates of the RF glow discharge, the ground plate as well as the excitation electrode, are extremely electron-rich areas. It has been found that substrates which are in close proximity or directly mounted to RF glow discharge electrodes tend to be surface damaged by the atomic species and electron bombardment inherently formed in the vicinity of said electrodes. Thus, the Reinberg reactor tends to damage the substrate circuits and the silicon nitride films so produced by the grounding of the substrates within the plasma glow discharge.

A fifth deficiency with Reinberg is that any nonparallelism between the substrate mounting fixture at ground potential and the upper driven electrode of the RF glow discharge will cause a nonsymmetry in the plasma so created. This can cause the plasma to "flicker" on and off in certain areas or have "hot" spots of extremely concentrated ions known in the art as "fireballs." This will cause a nonuniformity of coatings produced by such a reactor. Two attempts have been made to reduce the nonuniformity of coatings produced by such radial reactor. The first method increases the flow rates of the reactant gases in conjunction with an argon carrier gas to an extent such that the reactant gases are "brute forced" into the chamber in order to urge the plasma into a circularly uniform configuration. Second, as incorporated in the Applied Materials reactor, the substrate mounting fixture is rotated so as to attempt to eliminate coating nonuniformities on a sample-to-sample basis. An increase in the flow rate of the reactant gases is an extremely inefficient method to improve deposition uniformity and wastes expensive materials. Rotating the substrate table is a technically inefficient method for achieving coating uniformity, because RF glow discharge plasma deposition is not a momentum transfer technique for the deposition of a thin film. Fixture rotation is common in sputtering and electron beam evaporation where a stream of particles is actually physically directed at the substrate to be coated. In RF glow discharge, such a technique is inconsistent with the physics of the reaction; if the plasma was uniform and the gas flows were uniform, substrate rotation would have no effects upon coating uniformity.

Sixth, both the teachings of Reinberg and the physical construction of the Applied Materials Plasma I reactor require that the substrates be heated to some several hundred degrees Centigrade. In practice, failure to heat the substrates according to the teachings of Reinberg and the instructions for use of the Applied Materials reactor causes totally unacceptable silicon nitride films (poor adhesion, porosity, very low deposition rates, etc.) However, heating silicon substrates is definitely not beneficial for the junctions and circuits resident thereon and in some cases is totally damaging thereto. Moreover, heating introduces stresses into the silicon nitride film when said films are cooled to room temperature.

U.S. Pat. No. 4,066,037 to Jacob describes an RF glow discharge apparatus as might be used to apply a series of films including silicon nitride. As with all plasma reactors, changing the composition of the reactant gases will change the chemistry of the film so produced. The teachings of Jacob are embodied in commercially available plasma deposition systems known as the System 8000 and System 8001 manufactured by LFE Corporation, Waltham, Mass. Jacobs teaches the use of a cylindrically shaped reaction chamber about which are wound a plurality of inductive coils. The coils are connected to an RF source which is used to excite an RF glow discharge plasma within said chamber having nitrogen gas flowing therethrough. As a result of the positive flow of the nitrogen gas, the plasma "tail flame" extends into the area where the substrate is mounted. The substrate is rigidly affixed to a mounting fixture held in a horizontal plane and connected to a heater so as to raise the temperature of the substrate during the deposition process. In addition, silane gas is piped into the region above the substrate through a plurality of orifices attempting a substantially even distribution of silane into the vicinity of the substrate. The nitrogen plasma is intended to energize the silane gas to the point of dissociation in order to permit the silicon and nitrogen species to form a silicon nitride film upon the surface of the substrate.

Jacob suffers from some of the same technical deficiencies as Reinberg heretofore discussed. First, the substrate is disposed in a horizontal attitude again permitting particulate contamination to fall upon the substrate surface and be included within the ultimately formed film. Second, the substrate must be heated thereby creating the same problem of internal stresses in films so produced and potential damage to circuits as discussed above. Third, the nitrogen plasma is required to perform the dissociation of the silane in order to form the silicon nitride film. However, it is unclear in Jacob exactly how the nitrogen species are to enter the space between the orifices supplying the silane and the substrate surface. The mixture of reactant gases is inherently uneven and subject to yielding uneven film quality and incorporating sufficient nitrogen therewithin. Fourth, as the substrate to be coated is not located within the area of excitation and formation of the RF glow discharge but downstream therefrom, nitrogen that has been dissociated to form nitrogen ions is permitted to significantly recombine by the time the nitrogen ions reach the area of the substrate. In order to minimize this effect, the flow rates of nitrogen gas are increased to an extent that physically urges the plasma into the area of the substrate. The high flow rates to achieve adequate excitation of the silane and an adequate presence of the nitrogen ions in the area of the substrate are inefficient, consume expensive reactant gases and produce a high volume of effluent "waste" gases that must be disposed of. Fifth, Jacob teaches that the substrate is rigidly mounted to a fixture at ground potential with respect to the RF excitation source. For reasons discussed heretofore with respect to Reinberg, it is undesirable to place the substrate at ground potential within a plasma deposition process because of the free electrons in such a region and the damage that can occur to the substrate surface during the very process which is meant to protect it (i.e., deposition of an impervious film of silicon nitride).

In addition to the prior art as described herein, a production plasma deposition system is manufactured by Tegal Corporation known as PLASMADEP 300. The PLASMADEP 300 is arranged in a rectangular configuration with reactant gases entering above from an inlet. Ammonia, silane, and nitrogen mix in an upper chamber ad pass through an etched metal screen which functions as the "hot" RF electrode for achieving the plasma. Substrates are mounted to a horizontal fixture which is at RF ground potential with heaters connected thereto. Operating at several hundred degrees centigrade, an RF plasma is created between the driven screen and the substrate fixture with substrates attached thereto. Waste gases exit from below the substrate fixture to a vacuum pumping system.

The PLASMADEP 300 suffers from some of the same inherent problems as discussed above for the other prior art plasma reactors. First, there is considerable direct flow of reactant gases around the substrate fixture that never enters the vicinity of the substrates for coating. Second, the flow of gases is substantially stagnated in the vicinity of some of the substrates causing an inherent flow variation of gases from sample to sample. Third, the inherent flow variation of gases causes sample coating nonuniformity. Fourth, the use of heat creates the same film stress problems and circuit boundary problems as discussed heretofore. Fifth, the efficiency of the reactor is dependent upon near complete mixing of the reactant gases. Otherwise, an uneven film will result. Sixth, the use of ammonia as a nitrogen donor to the silicon nitride film is corrosive and contaminating as discussed heretofore. Seventh, the use of a single plasma causes uneven dissociation of silane and nitrogen because of their widely divergent internal binding energies. Eighth, flow rates are extremely high in an attempt to achieve plasma uniformity and ultimate film uniformity through the use of an argon carrier gas, an expensive and inefficient solution to the inherently nonuniform gas flow of the reactor design.

For these reasons, the technology of the prior art has been inadequate to reliably create silicon nitride films by an RF glow discharge plasma which can withstand the rigors placed upon such a film by the semiconductor industry.

SUMMARY OF THE INVENTION

It is thus an object of the present invention to provide an RF glow discharge plasma deposition apparatus which is capable of despositing silicon nitride as well as other thin film materials in a manner such that the films so produced are free of contamination, continuous, well-adhering to the substrate, and repeatable.

It is another object of the invention to provide a silicon nitride deposition system by RF glow discharge plasma which does not require the use of ammonia gas as the nitrogen donor.

It is another object of the present invention to provide an apparatus for the RF glow discharge deposition of silicon nitride which does not require the heating of the substrates to be coated.

It is yet another object of the present invention to provide an RF glow discharge apparatus which is capable of producing a film suitable as a dielectric layer in active components of integrated circuits and as a diffusion mask for gallium arsenide in the manufacture of light emitting diodes.

It is a further object of the present invention to provide an apparatus capable of depositing films in an RF plasma utilizing reactant gases which do not lend themselves to premixing due to creation of a pyrophoric reaction therebetween.

It is yet another object of the present invention to provide an RF plasma deposition apparatus where the substrates to be coated are at a vertical attitude to prevent contamination from falling thereon.

It is another object of the present invention to provide an RF plasma deposition system which does not employ an inert carrier gas mixed with the other reactant gases.

It is another object of the invention to provide an RF plasma deposition system with relatively high sample throughput so as to lend itself to high production applications.

It is yet another object of the present invention to provide an RF plasma deposition system which coats substrates with a thickness variation of the films so produced of less than five percent across a substrate and less than five percent substrate to substrate.

It is yet another object of the present invention to provide an RF plasma deposition apparatus in which the substrates are fixtured in the so-called "positive column" and not in the "dark sheath" surrounding the electrodes.

It is another object of the present invention to provide an RF plasma deposition apparatus in which the substrate fixtures are not RF biased in any way and in which the substrates are allowed to "float" electrically in the discharge.

It is yet another object of the present invention to provide an RF plasma deposition apparatus in which the reactant gases flow under essentially laminar conditions.

The invention is an apparatus for the RF deposition of film coatings upon a plurality of substrates. Substrates are arranged in substrate holders or "frames" in a vertical attitude within the reaction chamber. While the apparatus has extremely broad application to the deposition of many films, for the deposition of silicon nitride, silane and nitrogen gases are vented into the chamber from one side of the chamber. Although the silane and nitrogen gases enter the system through tubes of relatively small cross section, separate gas distribution systems distribute the silane and nitrogen gases so that a substantially even, uniform, and laminar flow is established across the entire gas inlet plane of the reaction chamber.

Both nitrogen and silane reactant gases vent into the chamber uniformly through a plurality of parallel vertical channels. The channels are the equal depth and are covered with a stainless steel screen which is held at RF ground potential. The channels through which the silane enters the chamber contain a baffle plate around which the silane must flow in order to establish a uniform gas density throughout the chamber. The channels into which nitrogen gas vents contain a baffle which also functions as an RF electrode connected to a first RF generator system (RF generator plus matching network) in order to form a glow discharge which is struck between the nitrogen electrode and the grounded screen across the channels. In this manner, silane gas vents into the central reaction chamber in conjunction with atomic nitrogen which has been dissociated by local plasmas created within small, dedicated, pre-chambers. The chambers utilized to dissociate the nitrogen gas into elemental, atomic nitrogen are known as "atomizer" chambers.

Within the reaction chamber coating cavity, a plurality of substrates arranged in a symmetrial square are held in frames. The frames are designed for maximum open area so that gases may flow around and between substrates with as minimal a perturbation to the laminar flow as possible. Substrates and frames are maintained at a "floating" RF potential; they are neither grounded nor "hot" with respect to the RF generators. Beyond the substrate frames is a second stainless steel screen or mesh to which is connected a second RF generator system. The second RF generator system is utilized to strike a plasma within the silane gas in the main reaction chamber in the vicinity of the substrates and to maintain the elemental character of the nitrogen atoms already dissociated by the atomizer cavities. Separate RF generators operating in phase are utilized for RF excitation of the atomizer cavities and the main reaction cavity. Behind the screen which forms a "hot" RF electrode connected to the second RF generator system is located a baffle adapted to enhance uniform flow of exhaust gases leaving the vicinity of the frames holding the substrates to be coated. The baffle is designed so that gases must flow around each substrate in a pattern calculated to eliminate significant uneven flows in the area of any substrate. Behind the baffle is located a vacuum port connected to a vacuum pumping system.

It is thus an advantage of the apparatus of the present invention to be able to dissociate diatomic nitrogen in a local plasma adapted and controlled for that purpose alone. Therefore the efficiency of the dissociation of nitrogen may be optimized without effecting reaction characteristics of dissociation in the vicinity of the substrates.

It is another advantage of the present invention that the substrates are not grounded with respect to either RF generator thereby eliminating the problem of large numbers of free electrons in the vicinity of RF electrodes and resultant damage therefrom.

It is a further advantage of the present invention that neither heat nor ammonia gas is required to carry out the deposition of silicon nitride.

It is yet another advantage of the present invention that the flow rate of reactant gases are considerably less than the plasma reactors of the prior art.

It is another advantage of the present invention to be capable of applying many different film compositions by merely varying the gas flow rates and RF excitations without significantly modifying the mechanical structure of the reactor chamber.

These objects and advantages of the present invention are made clear by the following description of a preferred embodiment in conjunction with the referenced drawing figures.

DESCRIPTION OF THE PREFERRED EMBODIMENT OF THE INVENTION

Reaction Chamber

Figure 1:
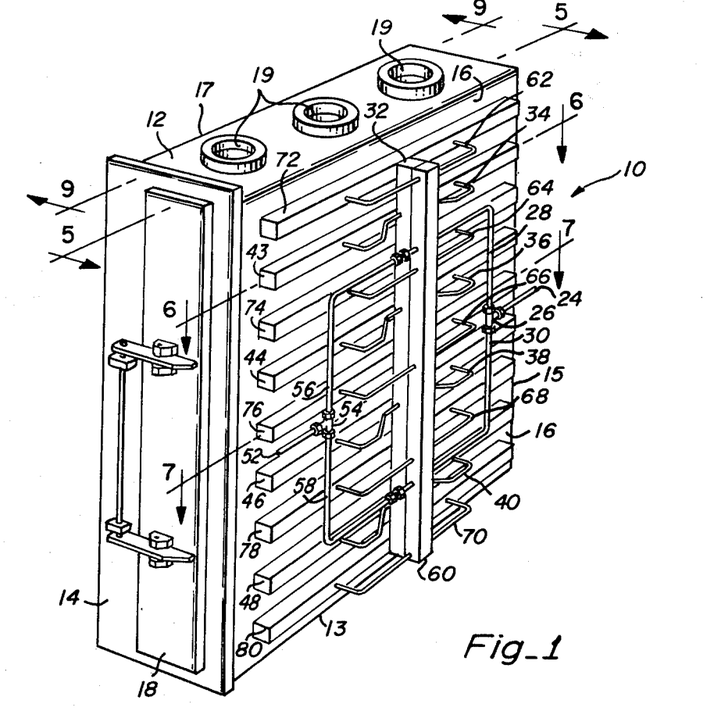
FIG. 1 is a perspective view of a RF plasma deposition reaction chamber system of the present invention.

FIG. 1 illustrates an RF plasma deposition reaction chamber system of the present invention and is referred to by the general reference character 10. The system 10 includes a chamber 11 formed by a top wall 12, a bottom wall 13, a side wall 14, a side wall 15, a front wall 16 and a back wall 17. The system 10 includes a substrate load door 18 in the side wall 14. FIG. 1 illustrates the door 18 in a closed position as it would assume during operation, i.e., depositing a film on a substrate. When the substrate load door 18 is open, substrates, e.g., circular silicon wafers, mounted upon suitably adapted frames (discussed hereafter) may be inserted into the interior of the reaction chamber 11. Upon the conclusion of depositing coating on the substrates, substrates may be extracted from the coating chamber 11 through the load door 18. While substrates may be manually inserted within the reaction chamber 11 through the substrate load door 18 and extracted manually therefrom, it is within the concept of the invention that an automated loading and unloading scheme utilizing a "loadlock" could be attached to the system 10 about substrate load door 18. A "loadlock" is known in the art as a pre-chamber which isolates the actual reaction chamber from atmospheric conditions to prevent entry of contamination into the reaction chamber. When using a loadlock, it is common for the reaction chamber to always have a vacuum maintained therewithin.

As illustrated in FIG. 1, a series of tubes of substantially square cross section traverse the exterior of the front wall 16. These tubes are utilized for delivering and distributing reactant gases into the interior of the reaction chamber 11 and are described in further detail in connection with other figures of the drawings. The system 10 is designed to function under the continuous operation of a vacuum pump (not shown) which is adapted to maintain certain critical pressures within the reaction chamber 11. This is described in greater detail below.

In addition the system 10 includes three window ports 19 located in wall 17 in the preferred embodiment for convenient visual access to the interior of the system.

Figure 2:
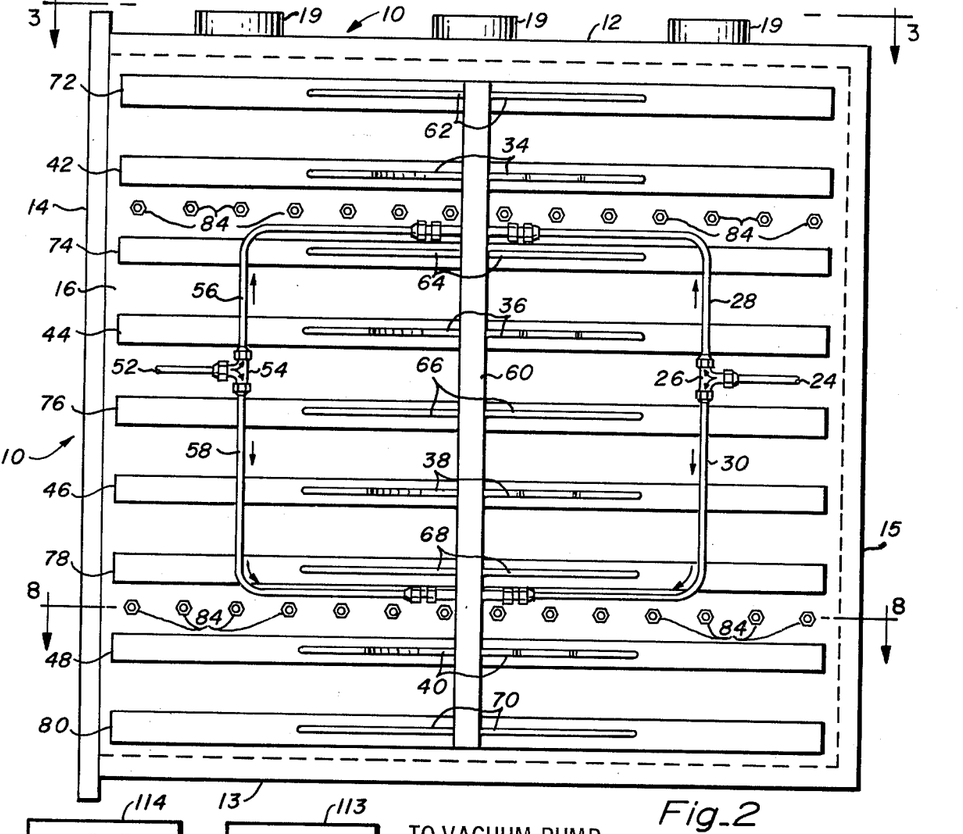
FIG. 2 is a front plan view of system of FIG. 1.
Figure 3:
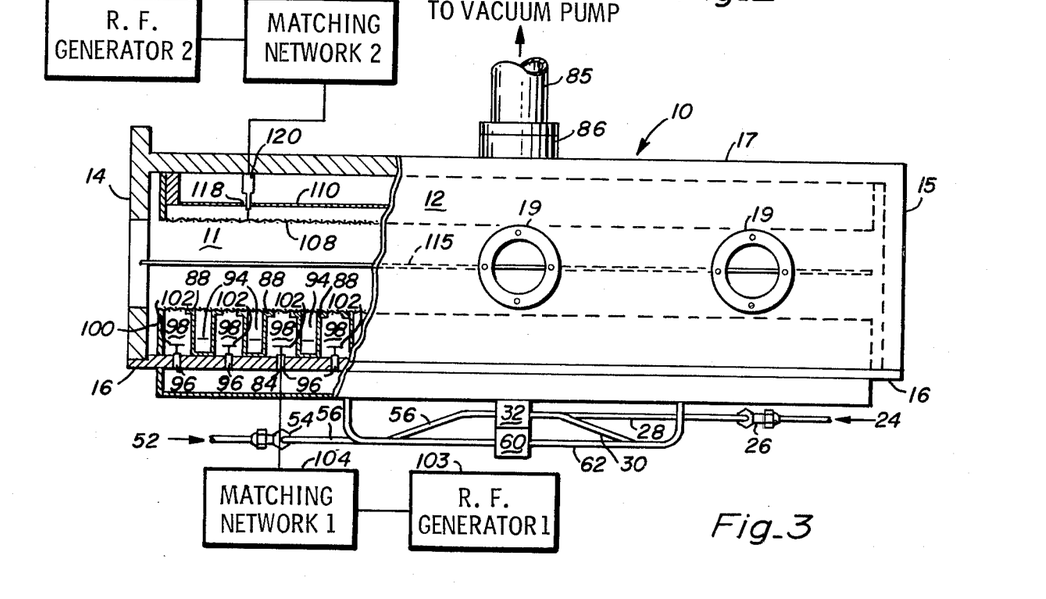
FIG. 3 is a top plan view of the system of FIG. 1 with a portion broken away to illustrate the interior.
Figure 4:
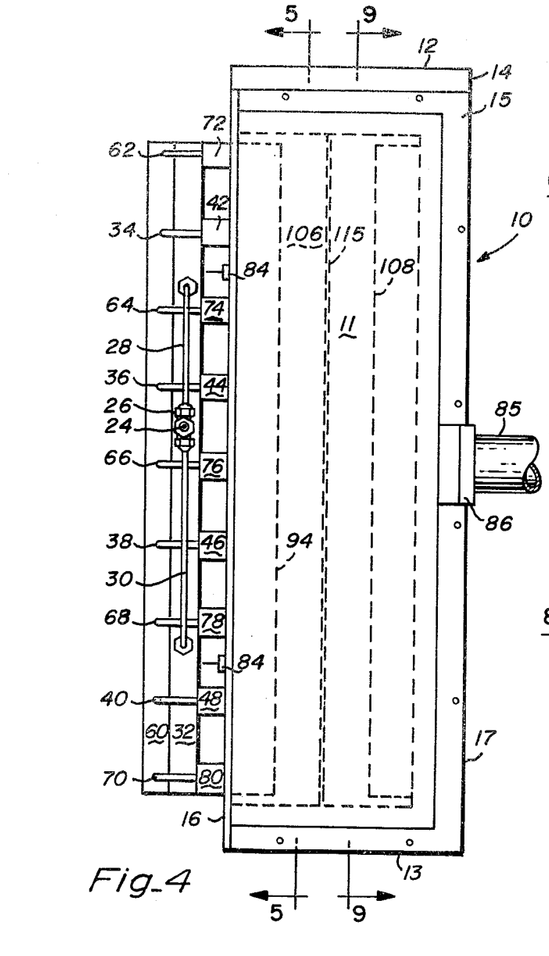
FIG. 4 is a side plan view of the system of FIG. 1.

FIGS. 2, 3 and 4 respectively illustrate a front, top and side plan view of the reactant gas distribution system 10 of FIG. 1. A first gas input portal 24, e.g., to receive silane gas, is provided about the front wall 16. The portal 24 extends to a T-fitting 26 joined to a pair of distribution tubes 28 and 30. The distribution tubes 28 and 30 connect to a vertical conduit 32 as shown in FIG. 3. The vertical conduit 32 is provided to carry gas, e.g., silane, to a plurality of distribution tubes 34, 36, 38 and 40 projecting from the conduit 32. The distribution tubes 34, 36, 38 and 40 are each respectively connected to a manifold 42, 44, 46, and 48. In this manner, the gas, e.g., silane, may be distributed from the input tube 24, which may be of relatively small cross sectional area, in a uniform, symmetrical manner to the four larger manifolds 42, 44, 46 and 48. The gas manifolds 42, 44, 46 and 48 connect to the interior portion of the reaction chamber 11 by inlet orifices described hereafter.

In a similar manner, a second gas, e.g., nitrogen, may enter the system 10 through an input portal 52. The input portal 52 connects to a T-fitting 54 which connects to a pair of distribution tubes 56 and 58. The distribution tubes 56 and 58 thereafter connect to a vertical conduit 60. In this manner, the second gas is ducted vertically across the front wall 16 of the chamber 11 in a uniform fashion. Connected to the vertical conduit 60 are a plurality of distribution tubes 62, 64, 66, 68 and 70. The distribution tubes are each respectively connected to a gas manifold 72, 74, 76, 78 and 80. In a manner analogous to the distribution system for the first gas, the second gas may be distributed in an even, symmetrical manner over the entire frontal face 16 of the reaction chamber 11. The second gas is ducted into the interior of reaction chamber 11 by orifices joined to the manifolds 72, 74, 76, 78 and 80 as described below.

The chamber 11 includes twenty-eight radio frequency (RF) feedthroughs 84 arranged in two rows of fourteen each in the front wall 16 (see FIG. 2). One row of feedthroughs 84 is positioned between the first gas (e.g., silane) manifold 42 and the second gas (e.g., nitrogen) manifold 74. The other row of feedthroughs 84 is positioned between the first-gas manifold 78 and the second-gas manifold 48. The RF feedthroughs 84 are adapted to supply RF excitation to the atomizer cavities as hereafter described.

FIG. 3, being a partial cutaway view taken through the top wall 12 of the chamber 11, illustrates a partial view of the internal gas distribution system. A throttle valve 86 is attached to the back wall 17 and an exit from the chamber 11 in series with a vacuum connection 85. In an RF plasma deposition system, it is important to have the capability for independently controlling the pressure inside the reaction chamber and the flow rate of gases therethrough. This is achieved in the system of the present invention by control of throttle valve 86 which, in conjunction with the vacuum pump, provides the ability to "fine tune" the system 10 for optimal deposition characteristics.

The interior of the reaction chamber 11 comprises a plurality of elongated U-shaped channel members 88 welded to the interior of the front wall 16 constructed from stainless steel.

Figure 5:
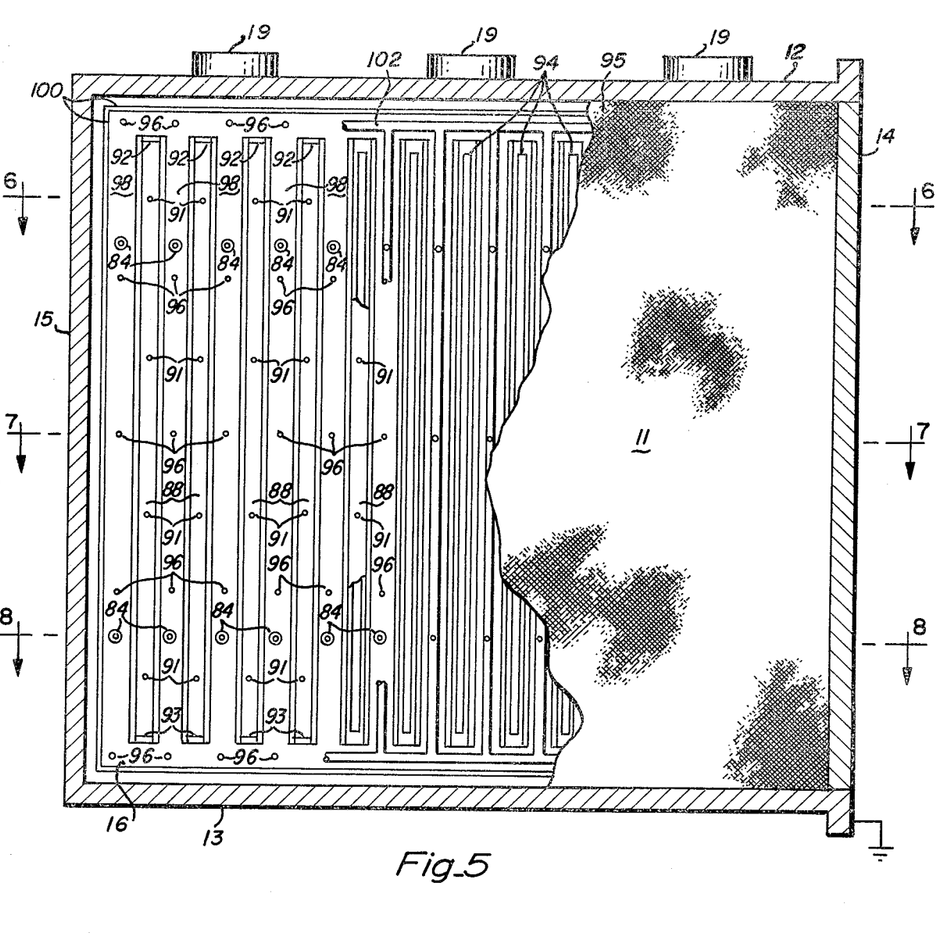
FIG. 5 is a front cross-sectional view of the system taken along the line 5—5 of FIG. 4 and with the screen partially broken away.

As partially illustrated in FIG. 5, thirteen channel members 88 are welded and rigidly affixed to the wall 16 with the members vertically within the chamber 11. Each formed-channel 88 is connected by a plurality (i.e., four) of orifices 91 to the gas manifolds 42, 44, 46 and 48. Each channel member 88 is closed about the top and the bottom ends by a pair of walls 92 and 93 respectively. Thus each formed-channel 88 communicates with four inlet flows of the first gas (e.g., silane) equally, symmetrically, and uniformly distributed over the length of the formed-channel 88 within the chamber 11. As there are thirteen formed-channels 88 and four inlets 91 per channel, there are a total of fifty-two inputs to the reaction chamber 11 for the first gas. In a constructed model of the system 10, the design of the entire gas distribution system for both the inputs of first gas (e.g., silane) and the second gas (e.g., nitrogen) provided distribution of the flow of the gases from small inlet tubes evenly over approximately a one square meter area.

Included within and extending the entire length of each channel member 88 is a baffle 94 as shown in FIGS. 3 and 5. The baffles 94 are adapted to force the first gas to flow from the four inlet orifices 91 around the associated baffle 94. The baffles 94 thereby enhance even distribution of the silane gas across the entire interior of the reaction chamber 11 within the system 10. The formed-channels 88 and baffles 94 are all maintained at electrically ground potential affixed to the front wall 16. Across the face of all formed-channels 88 is rigidly affixed a stainless steel mesh or screen 95 which is at ground potential with respect to RF excitation (see FIGS. 5 and 6). The ratio of open areas to closed areas within the screen 95 is important because in an RF plasma system the total area of ground electrode should be equal to or greater than the total area of driven or "hot" electrode. As described hereafter, the system of the present invention utilizes two "hot" RF electrodes and a single ground electrode screen 95. As ground screen 95 supplies the entire RF ground plane, it is a mesh of fine stainless steel wires. In a constructed embodiment, it has been found suitable to utilize a screen 95 of a 325 mesh, 30% open area of 304 or 316 stainless steel screen material with a 0.0014 inch diameter wire.

In between each formed-channel 88 is a column of five gas inlet orifices 96 for the second gas (see FIGS. 3 and 5). The exterior walls of the channel walls 88 form intermediate elongated chambers 98 known as "atomizer" chambers within which the nitrogen (second gas) plasma may be ignited. In a constructed embodiment of the system 10, five nitrogen gas manifolds 72, 74, 76, 78, and 80 and fourteen atomizer cavities 98 are included. Thus, there is a total of seventy inlet orifices for nitrogen gas to enter the interior of the reaction chamber 11. In this manner, analogous to the silane (first gas) gas distribution through the formed-channels 88, in a constructed embodiment the nitrogen gas is distributed from the inlet tube 52 which is of relatively small cross-sectional area to a uniform area of approximately one square meter.

In the system 10, there are twelve atomizer cavities 98 formed between the formed-channels 88 and two atomizer cavities 98 (the leftmost of which is shown in FIG. 5) which are bounded on one side by one of the channels 88 and on the other side by an atomizer enclosure 100 formed by four walls arranged in a rectangular configuration. The atomizer enclosure 100 is at ground potential and comprised of stainless steel rib material. The enclosure 100 completely encompasses all formed-channels 88 thereby establishing a nitrogen gas barrier around the periphery of the atomizer cavities 98. In this manner, nitrogen gas is forced to circulate and completely surround all silane gas entering the interior of the reactor chamber 11.

Figure 6:
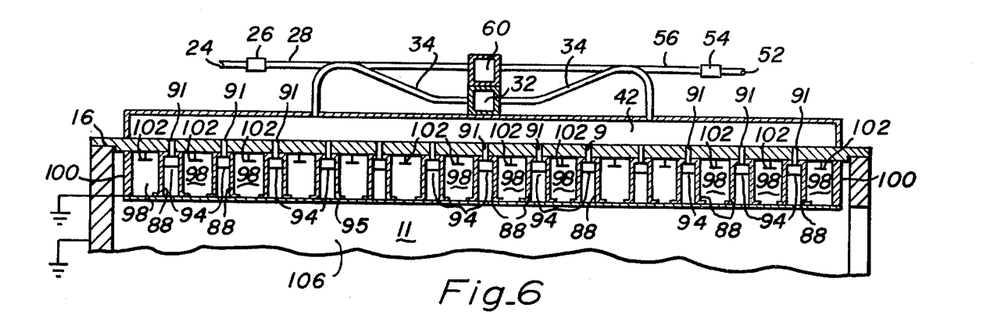
FIG. 6 is a cross-sectional view of a part of the system taken along the line 6—6 of FIGS. 1 and 5.
Figure 7:
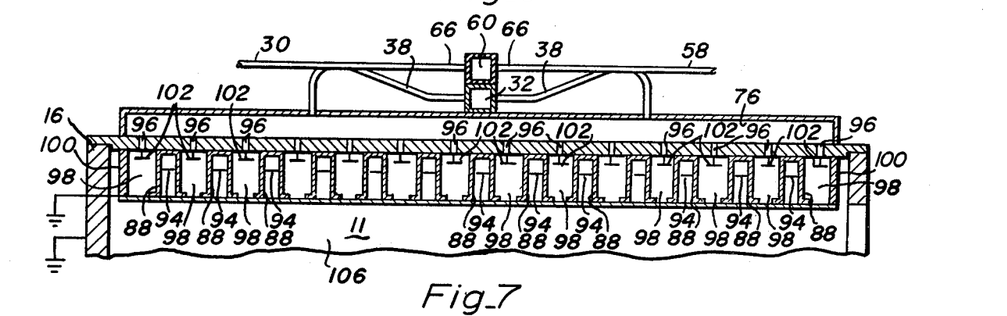
FIG. 7 is a cross-sectional view of a part of the system taken along the line 7—7 of FIGS. 1 and 5.
Figure 8:
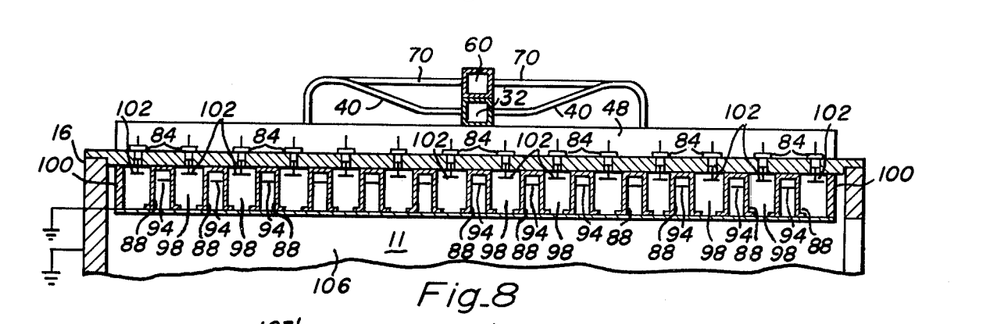
FIG. 8 is a cross-sectional view of a part of the system taken along the line 8—8 of FIGS. 2 and 5.

Within each atomizer cavity 98 is an electrode 102 extending the length of each atomizer cavity (see FIGS. 3, 5–8). The twenty-eight RF feedthroughs 84 (see FIG. 2) attach to the atomizer electrodes 102 in order to connect RF excitation to said atomizer electrodes. A partial cross-sectional view through the RF feedthroughs 84 is shown in FIG. 8. The atomizer electrodes 102 are connected to an RF generator 103 through a first matching network 104. When RF excitation is applied to the electrodes 102, a glow discharge is ignited within all of the atomizer cavities 98 resulting in dissociation of diatomic nitrogen gas into atomic, elemental nitrogen ions. Because of the configuration of the gas inlet manifold system, atomic nitrogen exits from the atomizer cavities in a substantially uniform fashion. Silane gas, on the other hand, exits from the formed-channels 88 through the orifices 91 (see FIG. 5). The gases flow through the openings in the ground screen 95 into a reaction chamber coating cavity 106 formed on one side by the screen 95. The cavity 106 is adapted to receive the substrates (e.g., silicon wafers) to be coated. As hereafter described the substrates are supported in a fixture while in cavity 106.

In FIG. 6, the gas distribution system for the first gas (e.g., silane) is illustrated as viewed along the line 6—6 which is taken through the gas manifold 42 of FIGS. 1 and 5. The vertical conduit 32 as shown feeds silane to the distribution tube 34. The distribution tube 34 empties into the gas manifold 42 at two places. Thereafter, silane gas uniformly exits into the reaction chamber 11 through the thirteen orifices 91 emptying into the formed-channels 88. Each formed-channel 88 contains one of the baffles 94 running lengthwise through said formed channel. Affixed to the face of all formed-channels 88 is the ground screen 95.

In FIG. 7 there is illustrated a partial view of the system 11 taken along the line 7—7 of FIGS. 1 and 5 illustrating the second gas (e.g., nitrogen) inlet system. Nitrogen gas under positive pressure fills the vertical conduit 60. Thereafter, the distribution tube 66 directs the gas to manifold 76 which uniformly distributes the gas horizontally. The nitrogen gas then flows through each of the fourteen inlet orifices 96 into the fourteen atomizer cavities 98. The atomizer electrode 102 in each atomizer cavity 98 serves as a baffle to force a uniform distribution of nitrogen gas within the respective atomizer cavities 98. Once a plasma is ignited, as a result of the electrical energy on the electrodes 102, atomic nitrogen will exit from the atomizer cavities 98 under a positive gas pressure through the openings in the ground screen 95 into the reaction chamber coating cavity 106.

FIG. 8 illustrates a partial cross-sectional view of the system 10 taken through the lines 8—8 of FIGS. 2 and 5. As illustrated, the RF feedthroughs 84 make electrical connection to the electrodes 102 in the atomizer cavities 98. As such, the RF power is transmitted into the atomizer cavities 98.

Figure 9:
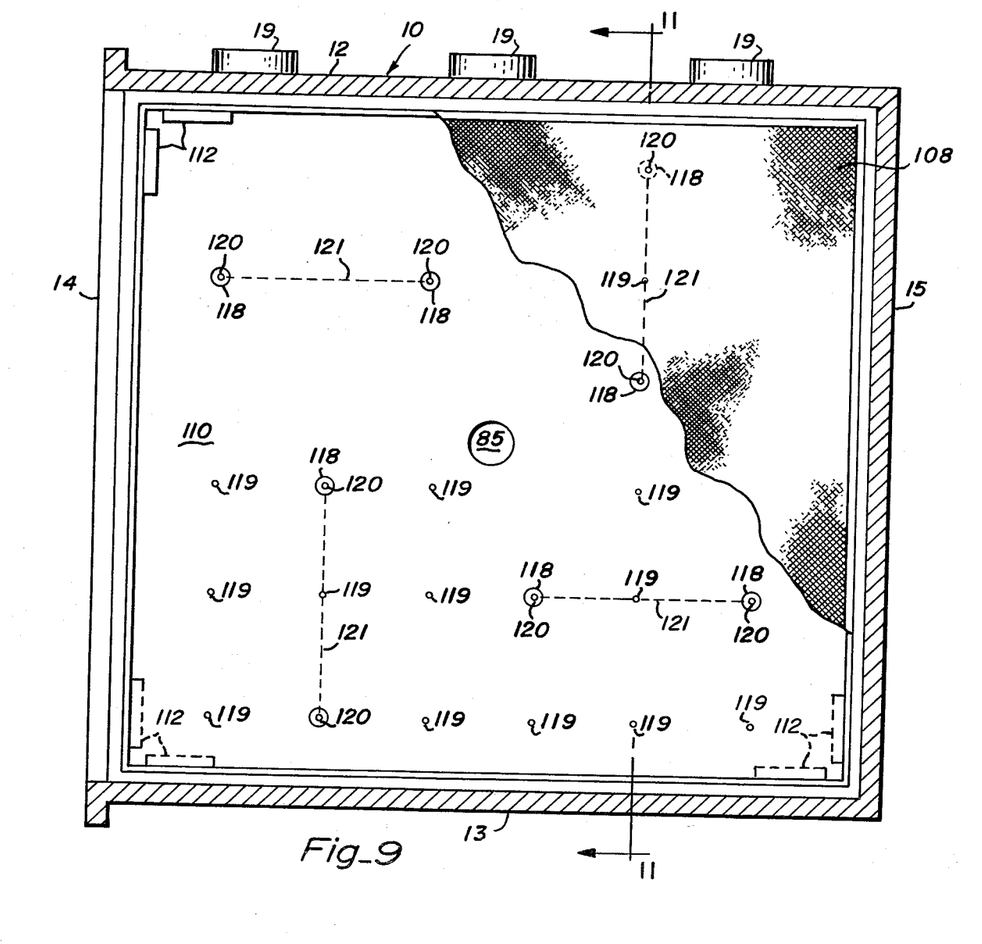
FIG. 9 is a cross-sectional view of the system taken along the line 9—9 of FIG. 4.
Figure 10:
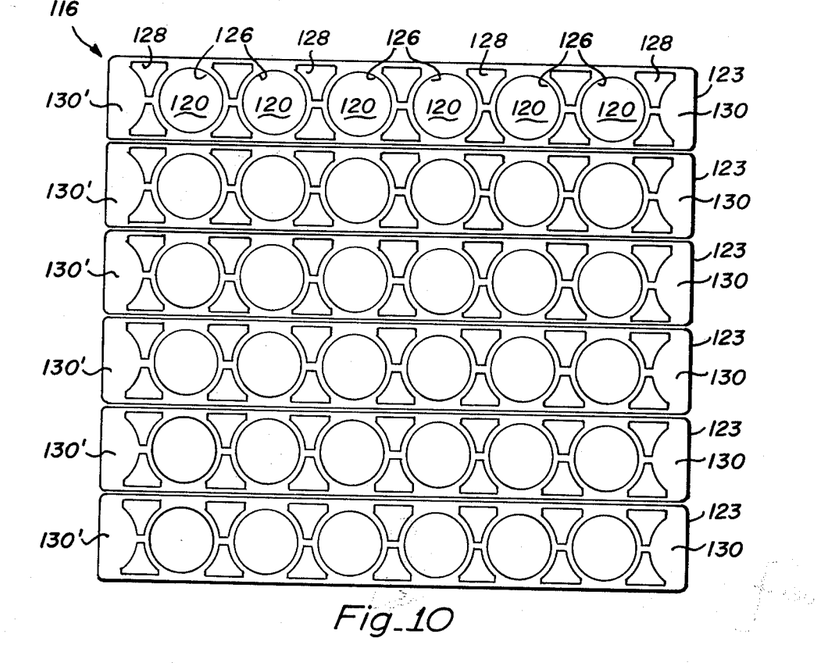
FIG. 10 is a planar view of a fixture for supporting substrates.

FIG. 9 is a cross-sectional partial view of the system 10 taken along the line 9—9 of FIGS. 1 and 4 and further illustrates a second RF electrode in the form of a screen 108, a vacuum baffle 110, and the vacuum connection 85. The RF electrode 108 is constructed of a stainless steel screen or mesh and is regidly affixed to a set of electrical insulator blocks 112 which are themselves rigidly affixed to exterior walls 12, 13, 14 and 15. It has been found suitable to construct second RF electrode 108 of an 18 mesh, 48% open 304 or 316 stainless steel screen with 0.017 inch diameter wire. As a design goal, the conductive electrode areas of the atomizer electrodes 102 plus the second RF electrode 108 has been kept less than the conductive electrode areas of the ground screen 94. Second RF electrode 108 is connected through second matching network 113 to a second RF generator 114 (see FIG. 2). When silane gas is flowing into the coating cavity 106 in conjunction with atomic nitrogen from the atomizer cavities and RF energy is applied to the RF electrode 108, a second plasma is ignited in the reaction chamber coating cavity 106. This second plasma dissociates silane into atomic silicon and hydrogen ions as well as tending to maintain the nitrogen in its elemental form. The combination of the two RF glow discharges (atomizer cavity plus silane discharge within reaction chamber coating cavity 106 struck between the RF electrode 108 and ground screen 95) creates a substantially uniform environment of elemental nitrogen and elemental silicon which can thereafter deposit upon substrates placed at substrate position 115 within the interior of reaction chamber 11 (see FIGS. 3 and 4). In supporting the substrates 115, they are supported on a fixture 116, a front planar view of which is shown in FIG. 10 and described hereafter in greater detail.

Figure 11:
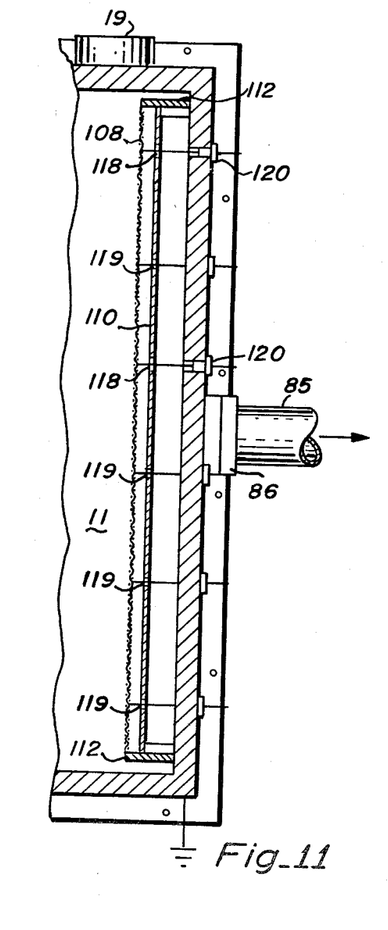
FIG. 11 is a partial cross-sectional view of the system taken along the line 11—11 of FIG. 9.

FIG. 11 illustrates a cross-sectional partial view of the system 10 taken along the line 11—11 of FIG. 9 to illustrate the far side of the system 10. The electrode 108 is located in front of the vacuum baffle 110. Vacuum baffle 110 forms holes corresponding with the center of circular positions assumed by symmetrical rows and columns of substrate wafers supported by the fixture 116 for coating within reaction chamber 11. For example, if it is desired to coat four inch diameter silicon wafers, there are thirty-six holes within the baffle 110 such that six rows and six columns of silicon wafers (substrates) can be processed. It has been found that when thirty-six silicon wafers are inserted within the reaction chamber 11, gases tend to flow evenly around each substrate through the vacuum baffle 110 and exit through vacuum connection 85.

Two types of vacuum pumping orifices 118 and 119 are included within the vacuum baffle 110. The vacuum orifices 119 (see FIG. 9) are simply holes through the vacuum baffle 110 located behind the position of a substrate. Each vacuum orifice 118 is of larger diameter than the orifice 119 in order to accommodate an RF feedthrough 120. In the preferred embodiment of system 10, eight feedthroughs 120 are illustrated and located as shown in FIG. 9. The eight RF feedthroughs 120 are symmetrically located and connected to the matching network 113 in order to be supplied with RF excitation from the RF generator 114. A plurality of lines 121 shown in phantom in FIG. 9 indicate the symmetry of the electrical connections of RF feedthroughs 120 to second matching network 113. Each RF feedthrough 120 is surrounded by one of the vacuum pumping orifices 118. The vacuum baffle 110 is designed so that the cross-sectional area of vacuum pumping orifice 119 equals the open cross-sectional area of the vacuum pumping orifice 118 with RF feedthrough 120 projecting therethrough. Moreover, the sum total of the cross-sectional areas of vacuum pumping orifices 118 and 119 is equal to or less than the cross-sectional area of vacuum port 85.

Substrate Fixturing

There are significant technical aspects to the fixturing of substrates, e.g., circular silicon wafers, during deposition using the present invention. One aspect relates to the RF potential of the substrates during the deposition process. As previously discussed herein, most RF plasma deposition systems of the prior art rigidly attach the substrates to a fixture maintained at RF ground potential. Experimentation has shown, however, that it is undesirable to locate substrates within the "dark sheath" of the RF plasma created by the RF ground electrode because the region surrounding the RF ground electrode is rich in free electrons. It is more desirable to locate the substrates to be coated within the "positive column" which is a relatively stable area within the plasma approximately centrally located between the positive and negative RF electrodes. In the apparatus of the present invention, the positive and negative electrodes in the reaction chamber coating cavity 106 are formed by the plane of ground screen 95 and the plane of second RF electrode 108. Thus, the substrate plane is defined to be position 115 (see FIGS. 3 and 4). The substrates electrically "float" at position 115; i.e., they are neither grounded nor "excited" with respect to the defined RF potentials. In this manner, the substrates tend to have a minimal perturbation upon the RF plasma within the reaction chamber coating cavity 106.

As a second technical aspect, the design of the substrate fixtures has been approached in a manner so as to achieve uniform laminar gas flow in the vicinity of the substrates to be coated. In the RF glow discharge plasma deposition system of the present invention, the substrate fixturing arrangement 116 has been designed to be integral with the laminar gas flow established by the gas inlet and vacuum manifold systems. Referring again to FIG. 10, the substrate fixture assembly 116 accommodates six rows of six circular substrates 120 of 100 mm diameter each for a full chamber load. Six identical substrate frames 123 are shown in FIG. 10. Each substrate frame 123 contains positions for six circular wafers or substrates 120. The surface of the substrate 120 to be coated is inserted from the rear of substrate frame 123 so that when placed within reaction chamber coating cavity 106 the surface to be coated faces the ground screen 95. In the preferred embodiment, 100 mm diameter substrates simply "drop" into the frame 123 and are held therein by a thin peripheral undercut 126 formed into each substrate position. Substrates rest against the thin peripheral undercuts 126 and are gently prevented from falling away from said undercuts by simple spring clips from the rear (not shown). Substrate frames 123 are designed for minimal perturbation of the substantially laminar gas flow to achieve this end. Frames 123 have frame openings 128 symmetrically located about the substrates 120. In the fixture 116, the frames 123 are designed for maximum symmetrical open area. End effects of gases flowing around the substrate frames 123 have been minimized by creating one-half of a "dummy" substrate as part of frame 123 at two end positions 130 and 130'. In this manner, gas flow in the areas of the substrates 120 is extremely uniform even for the end substrates of each frame 123.

As an additional factor in attempting to achieve uniform gas flow around each substrate, each substrate 120 within frames 123 is located directly in front of either a vacuum orifice 118 or 119 shown in FIG. 9. The fixture 116 is designed so that when a full load of thirty-six 100 mm wafers are inserted within six frames 123, the center of each circular substrate will be directly in front of a vacuum orifice 118 or 119. In this manner uniform gas flow is urged around each substrate 120 and tends not to cluster or concentrate as in the radial flow reactors of the prior art. Moreover, the open space between the edge of each frame 123 and the interior walls 90 of the system 10 are approximately 0.5 inches in order to prevent pumping of the reaction gases unduly around the substrates.

In the preferred embodiment, the substrate frames 123 and vacuum baffle 110 along with associated components have been designed to accommodate six rows of six substrate wafers, each of 100 mm diameter. This is a common geometry of silicon wafers as presently used by the semiconductor industry. However, it is contemplated that users of the present invention may want to employ three-inch diameter or 125 mm diameter wafers as substrates to be coated. This can easily be accommodated by the present invention. For three-inch diameter wafers, different substrate frames 116 may be designed to accommodate eight rows of eight substrates each. The design for the frames of three-inch wafers are simply scaled and symmetrical versions of frames 123 as shown in FIG. 11. In order to accommodate 125 mm diameter substrates, five rows of frames with five substrates mounted in each frame are used. Again, for 125 mm diameter substrates, the design of the substrate frames are scaled and symmetrical with respect to frames 123 utilized for 100 mm diameter wafers. For accommodating alternative substrate diameters, it is also necessary to install a different vacuum baffle within reaction chamber 11. Vacuum baffle 110 as shown in FIG. 9 is designed to accommodate thirty-six 100 mm diameter substrates, but if three-inch or 125 mm diameter substrates are to be coated assuming use of appropriate substrate frames, a vacuum baffle having sixty-four or twenty-five vacuum orifices, respectively, would have to be used in order to equalize gas flow around each substrate. In addition to the foregoing, a redesign of vacuum baffle 110 to accomodate other substrate geometries will also require a redistribution in a symmetrical manner of RF feedthroughs 120 which supply second RF electrode 108 with RF excitation. It is not envisioned that any difficulty would result in supplying RF power to alternative vacuum baffle designs to the extent that RF power is applied in a symmetrical, uniform manner as is shown in FIG. 9 for the eight RF feedthroughs 120 utilized for a vacuum baffle 110 designed for thirty-six 100 mm diameter wafers.

Figure 12:
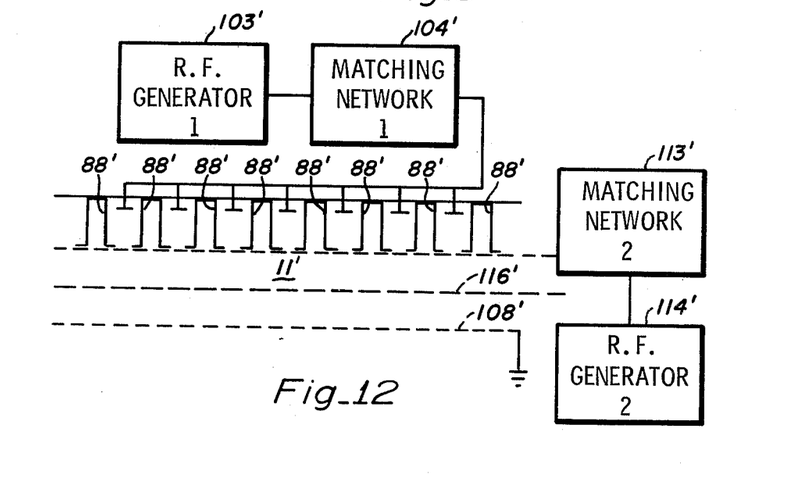
FIG. 12 diagrammatically illustrates an alternative embodiment for exciting a system of the present invention.

As an alternative embodiment to the present invention, the system of the present invention could be RF excited as shown in FIG. 12. In FIG. 12 reference numbers that refer to structures similar to the preferred embodiment have a prime designation. In this alternative the components are physically similar, but RF excitation is applied to atomizer electrodes 102' and screen 95'. Screen 95' is insulated from the ground potential of the system housing. Screen 108' is the ground potential. A first RF generator 103' supplies RF excitation to atomizer electrodes 102' through a first matching network 104'. A second RF generator 114' supplies RF excitation to screen 108' through a second RF matching network 113'.

System Operation

In order to operate the system 10 of the present invention, to deposit a silicon nitride film, thirty-six 100 mm diameter substrates 120 are loaded into six substrate frames 123. Each substrate frame 123 is held within a simple outer frame (not shown) so that the thirty-six 100 mm diameter substrates form a substantially rigid plane. The substrates are loaded into the chamber 11 through substrate load door 18. The chamber 11 is evacuated through vacuum connection 85 by means of an ordinary mechanical roughing pump. It should be noted that in the system 10 vacuum pumps of extremely high flow rates or extreme cleanliness are not required; that is, turbomolecular pumps, ion pumps, or titanium sublimation pumps are not required. Once a desired internal pressure has been achieved within the reaction chamber 11 (discussed in further detail below), nitrogen flow is then initiated and the vacuum pump is throttled through use of throttle valve 86 in order to achieve a certain predetermined pressure of nitrogen gas within the reactor (discussed in detail below). Thereafter, silane gas flow is initiated within the chamber 11 until a certain desired flow and pressure have been achieved. Next, RF excitation is applied to atomizer cavities 98 so as to ignite a plasma within said atomizer cavities. Thereafter, RF excitation is applied to the second RF electrode 108 so as to ignite a plasma within reaction chamber coating cavity 106. At this point substrate coating begins and proceeds until a desired film thickness has been deposited. Film thickness can either be measured by appropriate thickness gauges commercially available or, due to the predictable character of the apparatus of the present invention, the system 10 may simply be run for by a predetermined length of time to achieve a certain coating thickness. When the desired coating thickness has been achieved, RF energy is extinguished, gas flow is stopped and the chamber is evacuated by the mechanical roughing pump before breaking the chamber to remove the substrates.

In the preferred embodiment, the first RF generator 103 and the second RF generator 114 are utilized to provide RF excitation to atomizer electrode 102 and second RF electrode 108, respectively. The RF generators 103 and 114 are driven by a common oscillator so that they operate in phase. Commercially available RF generators operating at a frequency of 13.56 megahertz have been found to be suitable. A single RF generator with a RF power splitter has been utilized to supply both atomizer electrodes 102 and second RF electrode 108, but the adjustment of the flow of power when splitting the power output from a single RF generator is sensitive. Thus, the system 10 is much more easily controlled utilizing two distinct RF generators with a common oscillator.

First matching network 104 and the second matching network 113 are utilized to adjust power transfer from RF generators 103 and 114 to a condition of zero-reflected power (one to one VSWR). In a particular application, once coating conditions, RF power, and sample geometry have been fixed, the adjustments to matching networks 104 and 113 are minimal, if required at all. Generally, design of RF matching networks to transfer power from a fifty ohm exciter into a reactive load are in the art and not discussed further herein.

Coating Conditions

1. Gas Ratios

It has been shown generally with the plasma deposition system of the present invention for depositing silicon nitride that if the ratio of nitrogen to silane exceeds ten-to-one, films so produced are nitrogen rich, little film is deposited, and the film which is deposited etches rapidly in undiluted, 48% HF at 23° C. By the same token, films deposited with nitrogen to silane ratios of one-to-one or less (i.e., greater proportions of silane to nitrogen) end up depositing virtually elemental amorphous silicon with exceedingly low etch rates in undiluted 48% HF at 23° C. Also, conditions which tend to produce amorphous silicon also produce large amounts of powder within reaction chamber 11. The best conditions found to produce a suitable silicon nitride film have been with a nitrogen to silane ratio of between two-to-one and eight-to-one. Excellent silicon nitride films have been produced at a nitrogen-to-silane ratio of 2.5–3.0 to one. It should be noted that the ratio of nitrogen to silane gas found to be optimal is dependent upon the efficiency of the nitrogen atomizer. Deviations in design from the preferred embodiment as discussed herein will affect the rate of dissociation of diatomic nitrogen into atomic nitrogen consequently effecting the "raw" ratio of nitrogen gas to silane gas at the main system inputs.

2. Total Pressure

It has been generally found that at system coating pressures below 300 microns of Hg, there is not enough reactant material present within reaction chamber 11 to produce a practicably adequate deposition rate. Moreover, at pressures in excess of 600 microns Hg, the amount of power required to ignite the discharges is extremely large causing discharge nonuniformity and ultimately causing nonuniformity in the deposited coatings. It has been found most desirable to operate the system at a total internal pressure of approximately 425 microns Hg.

3. Flow

If flow rates of the reactant gases within reaction chamber 11 are too high, coating uniformity problems may result. Moreover, if flow rates are too low, the throughput of the system will be impaired. The optimal flow rate allows for the maximum deposition rate consistent with the production of excellent film properties. Toward that end, a flow rate of nitrogen gas on the order of 100 standard cc's per minute has been found to be acceptable (silane flow rate is adjusted for the proper nitrogen to silane gas ratio).

4. Power

Up to 500 watts continuous wave RF excitation has been applied on each RF electrode (atomizer electrodes 102 and second RF electrodes 108). Moreover, films have been produced with as little as thirty watts applied to second RF electrode 108 and seventy watts applied to atomizer electrodes 102. The amount of power necessary to produce excellent silicon nitride film properties is a function of the total pressure of gases within reaction chamber 11. Excessive power tends to cause unnecessary substrate heating and creates nonuniformities by inducing strong fields of charge on the substrates and fixtures. These induced charges may damage sensitive microelectronic circuitry and cause brittleness in films produced thereon. For a total pressure of 425 microns Hg, it has been found suitable to apply 300 watts of RF excitation to second RF electrode 108 and 250 watts to atomizer electrodes 102. It should be realized that because of the much smaller physical dimensions of atomizer cavities 98, application of 250 watts on atomizer electrodes 102 create a power density within atomizer cavities 98 much in excess of the power density within reaction chamber coating cavity 106 because atomizer cavities 98 have approximately one-quarter the volume of reaction chamber coating cavity 106.

5. Deposition Rate

Using the deposition conditions as described above, excellent silicon nitride film properties may be produced at deposition rates on the order of 200 Angstroms per minute.

6. Coating Uniformity

Using the apparatus under the conditions as described above, actual coating thickness variations do not exceed ±10% across any given wafer and the thickness of most substrates is within ±5%. Wafer-to-wafer uniformity was less than ±3% and observed in some coating runs to be as little as ±1%.

7. Film Properties of Silicon Nitride

Producing silicon nitride films as descirbed above in the RF glow discharge plasma deposition system of the present invention yields films of markedly superior properties. Critical film characteristics which are of interest to those skilled in the art are:

a. Index of Refraction

The index of refraction of beta crystalline $Si_3N_4$ is 2.02 when measured at HeNe laser wavelength. The index of refraction of films produced in the reactor 10 when applied according to the conditions described above in approximately 2.05. The index of refraction of silicon nitride films produced by RF glow discharge reactors of the prior art vary from 1.9 to 2.6 and are somewhat unpredictable.

b. Etch Rate

Beta crystalline $Si_3N_4$ etches in 48% HF at 23° C. at 70-90 Angstroms per minute. Silicon nitride films produced by the reactor of the present invention etch in 48% HF at 23° C. at 300 Angstroms per minute (approximately). Silicon nitride films produced by RF glow discharge reactors of the prior art etch too rapidly in 48% HG at 23° C. to measure but have been measured to etch in 10% HF at 23° C. at approximately 1000-5000 Angstroms per minute.

c. Internal Stress

RF glow discharge plasma deposition systems of the prior art produce internal stresses, partially the result of the high temperature of deposition, on the order of $10^{10}$ to $10^{12}$ dynes/cm$^2$, and the stress varies depending upon deposition conditions between compressive and tensile. Films produced by the system 10 under the conditions described above generally contain internal stresses on the order of $10^7$ to $10^8$ dynes/cm$^2$ and are uniformly compressive.

d. Adhesion

In order to test adhesion, one micron aluminum steps were applied to a silicon wafer. Wafers were then coated in the reactor of the present invention with silicon nitride films. Said films were thereafter heated to 550° C. and immediately immersed in liquid nitrogen. Films produced in the reactor of the present invention did not crack, craze, chip, or peel under such a test. In addition, silicon nitride films produced by the reactor of the present invention passed MIL Spec C675-A (Tape Pull Test).

e. Flatband Voltage

Flatband voltage is the measurement of the variation in capacitance of an insulating film (in this case, silicon nitride) as a function of applied voltage. The theoretical flatband voltage for beta crystalline silicon nitride is slightly less than one volt and shows little hysteresis. Silicon nitride films produced by the reactor of the present invention show slight hysteresis and exhibit a flatband voltage of approximately one volt. Silicon nitride films produced by RF glow discharge reactors of the prior art exhibit severe hysteresis and almost immeasurable flatband voltage characteristics (i.e., they puncture).

f. Temperature Stability

Silicon nitride films produced by the reactor of the present invention under conditions described above show excellent temperatrue stability up to 550° C. and do not exhibit cracking or crazing up to 1000° C.

g. Pinhole Density

Silicon nitride films produced by the RF glow discharge reactor of the present invention possess a pinhole density of less than five pinholes per square centimeter. Silicon nitride films produced by RF glow discharge reactors of the prior art exhibit a pinhole density of from fifteen to thirty pinholes per square centimeter.

While for the sake of clarity and in order to disclose the invention so that the same can be readily understood, the specific embodiments have been described and illustrated, it is to be understood that the present invention is not limited to the specific means disclosed. For example, the preferred embodiment has concentrated upon the application of silicon nitride films to thirty-six 100 mm diameter substrates. Clearly, substrates of other dimensions can be accommodated within the reactor of the present invention by making minor changes to the substrate frames and vacuum baffle as described above. Moreover, the reactor of the present invention is not limited to application of silicon nitride. For example, if diborane gas is substituted for silane within the reaction chamber, boron nitride may be formed. Boron nitride is an insulator of excellent characteristics that would be of extreme use in the semiconductor industry. Moreover, substituting diborane gas for silane eliminates the need to dispose of unwanted hydrogen as a byproduct of the reaction to form silicon nitride.

As another example, oxygen may be used instead of nitrogen as a first reactant gas with appropriate adjustments to operating conditions in the coating cavity. In this manner, a film containing silicon and oxygen may be formed (e.g., silicon dioxide or silicon monoxide). It is most dangerous to attempt deposition of films containing silicon and oxygen using prior art reactors as mixing silane and diatomic oxygen causes a pyrophoric reaction (i.e., explosion).

In addition, it is within the concept of the present invention that the first reactant gas and/or the second reactant gas is actually a mixture of gases. For example, doped films would be produced if small quantities of dopant gas (e.g., phosphine) are premixed within the first reactant gas and/or the second reactant gas. Moreover, if premixing is not practical, a plurality of gases may be introduced into the reaction chamber through alternating orifices or through alternating atomizer cavities by minor alterations to the gas inlet distribution system. The basic concept of the present invention is to provide by a local plasma a gaseous reactant species (e.g., elemental nitrogen) that would not otherwise be obtainable in nature and to flow said gaseous reactant species into a coating cavity in which another plasma is ignited. One or more local plasmas (i.e., atomizers) may be used to produce one or more reactant species which ultimately mix with one or more other reactant species within a main coating cavity plasma to form a film upon substrates.

The ability to apply films of many different compositions and properties is clearly contemplated in the present invention which is particularly adaptable to accommodating reactant gases of widely divergent internal binding energies or reactant gases which cannot be premixed due to certain adverse reactions. Thus, the present invention may clearly be embodied in other ways that will suggest themselves to persons skilled in the art.

It is believed that this invention is new and that all such changes that come within the scope of the following claims are to be considered as part of this invention.

What is claimed is:

1. A glow discharge plasma deposition apparatus for depositing a film on a substrate, comprising:
   a sealed housing adapted to contain a vacuum therewithin;
   means for connecting a vacuum pump to said housing through a vacuum port adapted to generally create a vacuum within said housing;
   means for receiving a first reactant gas;
   atomizer chamber means within said housing and adapted to allow said first reactant gas to flow therethrough;
   a first RF electrode located within said atomizer chamber means and electrically isolated from said housing adapted for receiving RF energy from a means for supplying RF energy;
   a second RF electrode located within said housing and electrically isolated from said housing adapted for receiving RF energy from a means for supplying RF energy;
   a third RF electrode located within said housing and adapted for connection to a reference potential;
   support means to support a substrate within said housing; and
   means for receiving a second reactant gas and flowing said second reactant gas into said housing in proximity to said support means;
   wherein the application of RF energy to said RF electrodes causes a glow discharge within said atomizer cavity with said first reactant gas flowing therethrough and causes a glow discharge within said housing with said second reactant gas and ionic species from said first reactant gas flowing therethrough so as to deposit a film upon said substrate.

2. The glow discharge plasma deposition apparatus of claim 1 wherein:
   said means for supplying RF energy to said first RF electrode operates in phase with said means for supplying RF energy to said second RF electrode.

3. The glow discharge plasma deposition apparatus of claim 2, wherein:
   said third RF electrode is a ground electrode connected to said housing.

4. The glow discharge plasma deposition apparatus of claim 1, further comprising:
   a throttle valve located between said housing and said vacuum port adapted to regulate gas flow therethrough.

5. The glow discharge plasma deposition apparatus of claim 1, wherein:
   said means for supplying RF energy to said first RF electrode and said means for supplying RF energy to said second RF electrode comprises a single RF power source connected to an RF splitter directing RF power to said first and said second RF electrodes.

6. The glow discharge plasma deposition apparatus of claim 3 wherein:
   the support means is adpated to support a plurality of substrates within the housing.

7. The glow discharge plasma deposition apparatus of claim 6, further comprising:
   a plurality of atomizer chamber means adapted to allow said first reactant gas to flow therethrough.

8. The glow discharge plasma deposition apparatus of claim 7, wherein:
   said ground electrode is substantially planar.

9. The glow discharge plasma deposition apparatus of claim 8, wherein:
   said plane of said ground electrode is substantially vertical.

10. The glow discharge plasma deposition apparatus of claim 9, wherein:
    the atomizer chamber means are connected to said plane of said ground electrode and said ground electrode is formed with a plurality of holes adapted to cover said atomizer chamber means while allowing said first reactant gas and ionic species to flow therethrough.

11. The glow discharge plasma deposition apparatus of claim 10, wherein:
    said means to locate said substrates is generally planar and located substantially parallel to said ground electrode.

12. The glow discharge plasma deposition apparatus of claim 11, wherein:
    said second RF electrode is substantially planar and located generally parallel to said support means to support said substrates on the opposite side of said support means from said ground electrode.

13. The glow discharge plasma deposition apparatus of claim 12, further comprising:

a vacuum baffle located between said vacuum port and said second RF electrode substantially planar in shape with a plurality of holes therethrough with the number of said holes equal to the number of said substrates which the support means can support within said deposition apparatus and with each hole centrally located behind each substrate support location.

14. The glow discharge plasma deposition apparatus of claim 9, wherein:

said second RF electrode is located generally in front of said plane of said atomizer chamber means and said second RF electrode is formed with a plurality of holes while allowing said first reactant gas to flow therethrough.

15. The glow discharge plasma deposition apparatus of claim 14, wherein:

said support means is generally planar and located substantially parallel to said second RF electrode.

16. The glow discharge plasma deposition apparatus of claim 15, wherein:

said ground electrode is substantially planar and located generally parallel to said support means to locate said substrates on the opposite side of said support means from said second RF electrode.

17. The glow discharge plasma deposition apparatus of claim 16, further comprising:

a vacuum baffle located between said vacuum port and said ground electrode substantially planar in shape with a plurality of holes therethrough with the number of said holes equal to the number of said substrates within said deposition apparatus and with each hole centrally located behind each substrate.

18. The glow discharge plasma deposition apparatus of claims 12 or 16, wherein:

said means for receiving a second reactant gas is adapted to conduct said second reactant gas between said ground electrode and said second RF electrode by uniformly flowing between said plurality of atomizer chamber means so as to form a substantially uniform mixture of said first and second reactant gases and ionic species formed therefrom in the vicinity of said substrate.

19. The glow discharge plasma deposition apparatus of claim 18, wherein:

the sum of the cross sectional areas of said holes through said vacuum baffle is equal to or less than the cross-sectional area of said vacuum port.

20. The glow discharge plasma deposition apparatus of claim 19, wherein:

said means to locate said substrates contains open areas symmetrically located around each substrate allowing reactant gases and ionic species to flow uniformly around each substrate through said frame, through said vacuum baffle, and out said vacuum port.

* * * * *